(12) United States Patent
Yonezawa

(10) Patent No.: US 8,674,717 B2
(45) Date of Patent: Mar. 18, 2014

(54) CANTILEVERED PROBE HAVING A BENDING CONTACT

(75) Inventor: Toshihiro Yonezawa, Nirasaki (JP)

(73) Assignee: Tokyo Electron Limited (JP)

( * ) Notice: Subject to any disclaimer, the term of this patent is extended or adjusted under 35 U.S.C. 154(b) by 354 days.

(21) Appl. No.: 12/746,252

(22) PCT Filed: Nov. 5, 2008

(86) PCT No.: PCT/JP2008/070107
§ 371 (c)(1),
(2), (4) Date: Jul. 20, 2010

(87) PCT Pub. No.: WO2009/072368
PCT Pub. Date: Jun. 11, 2009

(65) Prior Publication Data
US 2010/0277193 A1   Nov. 4, 2010

(30) Foreign Application Priority Data

Dec. 5, 2007   (JP) .................................. 2007-314194

(51) Int. Cl.
*G01R 1/067*   (2006.01)
(52) U.S. Cl.
USPC .............. 324/755.07; 324/755.06; 324/755.05
(58) Field of Classification Search
USPC ............... 324/754.03, 754.07, 754.1–754.14, 324/754.2, 755.01–755.11
See application file for complete search history.

(56) References Cited

U.S. PATENT DOCUMENTS

| | | | |
|---|---|---|---|
| 4,199,209 A * | 4/1980 | Cherian et al. ................ | 439/591 |
| 6,255,126 B1 | 7/2001 | Mathieu et al. | |
| 6,268,015 B1 | 7/2001 | Mathieu et al. | |
| 6,380,755 B1 | 4/2002 | Sato | |
| 6,443,784 B1 * | 9/2002 | Kimoto ......................... | 439/862 |

(Continued)

FOREIGN PATENT DOCUMENTS

| | | |
|---|---|---|
| CN | 101023363 | 8/2007 |
| JP | 2000-150598 | 5/2000 |

(Continued)

OTHER PUBLICATIONS

Korean Office Action—Korean Application No. 10-2010-7011584 issued on Jul. 28, 2011, citing KR 10-2001-0078403, JP 2005-292019, and JP 2000-150598.

(Continued)

*Primary Examiner* — Huy Q Phan
*Assistant Examiner* — Dustin Dickinson
(74) *Attorney, Agent, or Firm* — Cantor Colburn LLP

(57) ABSTRACT

A probe of the present invention includes a beam portion cantilevered by a holding portion, and a contact extending perpendicularly to and downward from a free end of the beam portion. An inner cut portion is formed on a fixed end side of the beam portion in a side portion of the contact, and an outer cut portion is formed on a free end side of the beam portion in a side portion of the contact, so that the outer cut portion and the inner cut portion are formed to bend the contact when the contact contacts an electrode of an object to be inspected at a predetermined contact pressure. According to the present invention, in inspection of electrical characteristics of the object to be inspected, suitable contact between the probe and the object to be inspected may be maintained and the durability of the probe may be improved.

1 Claim, 11 Drawing Sheets

(56) References Cited

U.S. PATENT DOCUMENTS

| | | | | |
|---|---|---|---|---|
| 7,057,406 B2* | 6/2006 | Chang et al. | ............ | 324/750.25 |
| 7,106,080 B2* | 9/2006 | Mori et al. | ............... | 324/756.03 |
| 7,176,703 B2* | 2/2007 | Flechsig et al. | .......... | 324/754.02 |
| 7,487,569 B2* | 2/2009 | Zahuranec et al. | .......... | 15/340.2 |
| 7,498,827 B2* | 3/2009 | Mochizuki et al. | ...... | 324/756.03 |
| 7,514,943 B2* | 4/2009 | Kimoto | ................... | 324/756.01 |
| 7,567,089 B2* | 7/2009 | Chen et al. | ............... | 324/755.11 |
| 7,573,281 B2* | 8/2009 | Kimoto | ................... | 324/755.06 |
| 7,583,101 B2* | 9/2009 | Miller | ..................... | 324/755.03 |
| 7,589,547 B2* | 9/2009 | Ismail | ..................... | 324/755.07 |
| 7,675,301 B2* | 3/2010 | Eldridge et al. | ......... | 324/755.05 |
| 7,808,261 B2* | 10/2010 | Kimoto | ................... | 324/754.22 |
| 7,944,224 B2* | 5/2011 | Kister | ..................... | 324/754.01 |
| RE42,637 E * | 8/2011 | Mochizuki et al. | ...... | 324/755.08 |
| 8,427,186 B2* | 4/2013 | McFarland et al. | ...... | 324/755.05 |
| 8,493,086 B2* | 7/2013 | Kimoto | ................... | 324/755.01 |
| 8,536,889 B2* | 9/2013 | Nelson et al. | ............ | 324/754.01 |
| 2002/0097064 A1 | 7/2002 | Sato | | |
| 2004/0051541 A1* | 3/2004 | Zhou et al. | ................... | 324/754 |
| 2005/0035775 A1* | 2/2005 | Zhou et al. | ................... | 324/754 |
| 2008/0001102 A1 | 1/2008 | Hoshino et al. | | |
| 2008/0036484 A1* | 2/2008 | Lee | ................ | 324/761 |
| 2008/0174328 A1* | 7/2008 | Miller | ........................... | 324/762 |
| 2009/0284272 A1* | 11/2009 | Yonezawa et al. | ............ | 324/754 |
| 2010/0033202 A1* | 2/2010 | Chen et al. | .................... | 324/762 |

FOREIGN PATENT DOCUMENTS

| | | |
|---|---|---|
| JP | 2002-531915 | 9/2002 |
| JP | 2005-292019 | 10/2005 |
| JP | 2006-119024 | 5/2006 |
| KR | 10-2001-0078403 | 8/2001 |

OTHER PUBLICATIONS

International Search Report—PCT/JP2008/070107 dated Feb. 24, 2009.

Japanese Office Action—Japanese Application No. 2007-314194 issued on Jun. 21, 2011, citing JP 2002-531915, JP 2005-292019, and JP 2000-150598.

* cited by examiner

CANTILEVERED PROBE HAVING A BENDING CONTACT

TECHNICAL FIELD

The present invention relates to a probe for inspecting electrical characteristics of an object to be inspected.

BACKGROUND ART

Inspection of electrical characteristics of an electronic circuit, such as an IC, LSI, or the like, formed on, for example, a semiconductor wafer is performed by using a probe card mounted on a probe device. The probe card, in general, includes a plurality of probes and a contactor holding the probes. The contactor has a bottom surface, on which the probes are held, facing the wafer. And, inspection of electrical characteristics of the wafer is performed by bringing the plurality of probes into contact with electrodes of the electronic circuit formed on the wafer and applying an electrical inspection signal to a corresponding electrode of the electronic circuit formed on the wafer from each of the probes through the contactor.

When the electrical characteristics of the electronic circuit are measured, in order to establish electrical connection between the electrodes of the wafer and the probes, a scrubbing process for exposing conductive portions of the electrodes by cutting off aluminum oxide films formed on surfaces of the electrodes is necessary. Accordingly, as shown in FIG. 9, a probe 100 including a beam portion 102 cantilevered on a contactor 101, and a contact 103 protruding and extending from the beam portion 102 toward a wafer W is used (Patent Document 1). Then, overdrive is applied so that the contact 103 and an electrode P of the wafer W are pressure-contacted to each other, and thus the beam portion 102 bends about a fixed end of the beam portion 102 to move the contact 103. Accordingly, an aluminum oxide film on a surface of the electrode P is cut off by a front end portion 104 of the contact 103, so that a conductive portion of the electrode P and the front end portion 104 of the contact 103 are brought into contact with each other.

PRIOR ART DOCUMENT

Patent Document (Patent Document 1) Japanese Laid-Open Patent Publication No. 2006-119024

DISCLOSURE OF THE INVENTION

Technical Problem

In order to appropriately perform inspection of electrical characteristics of the electronic circuit of the wafer W, it is necessary to cut off the aluminum oxide film which is an insulating layer on the surface of the electrode P so that the contact 103 contacts the aluminum under the surface layer of the electrode P and is pressure-contacted thereto at a predetermined contact pressure. Then, better contact is achieved as the amount of the aluminum oxide film cut off and the contact pressure is larger. However, since the contact 103 is formed to have a linear shape, a movement length of the contact 103 due to bending of the beam portion 102 also increases, as the contact pressure applied to the contact 103 and the electrode P increases. Therefore the amount of aluminum and impurities cut off by the contact 103 increases excessively. Then, the impurities are easily attached to the front end portion 104 of the contact 103 to become a protrusion and thus a deep dent is made and thus the electrode P is damaged when the contact 103 contacts the electrode P. Accordingly, the frequency of cleaning the contact 103 increases.

The cleaning of the contact 103, in general, is performed by pressing the front end portion 104 of the contact 103 against a cleaning sheet and by removing the attached substances. In this case, not only the attached substances but also the front end portion 104 itself of the contact 103 are polished and worn away.

Accordingly, if the frequency of cleaning the contact 103 increases as described above, the front end portion 104 of the contact 103 is easily worn away, thereby deteriorating the durability of the probe 100.

The present invention is proposed considering the aforementioned state of art. According to the invention, it may be obtained to maintain suitable contact between a probe and an object to be inspected, to suppress damage to the object to be inspected, and to improve the durability of the probe, in inspection of electrical characteristics of the object to be inspected.

Technical Solution

In the present invention, there is provided a probe for inspecting electrical characteristics of an object to be inspected by contacting the object to be inspected, the probe including a beam portion cantilevered by a holding member, and a contact extending from a free end of the beam portion toward the object to be inspected, wherein a cut portion is formed in a side portion of the contact.

According to the present invention, since the cut portion is formed in the side portion of the contact, a suitable contact pressure at which the contact and the object to be inspected contact each other is set, and thus the contact may bend at the position of the cut portion. That is, since the rigidity of the contact is reduced, the contact easily bends. Accordingly, since a force for moving the contact in a horizontal direction is lower than that of a conventional art without the cut portion, movement of the contact due to overdrive is stopped due to friction. Accordingly, a movement length of the contact is less than that of the conventional art, and a movement depth is also reduced, thereby suppressing damage to the object to be inspected. Also, due to the contact, the amount of not only an aluminum oxide film on a surface of the object to be inspected but also aluminum inside the object to be inspected, which is unnecessarily cut off, is reduced. Accordingly, the frequency of cleaning the contact is reduced, thereby improving the durability of the probe.

Advantageous Effects

According to the present invention, in inspection of electrical characteristics of an object to be inspected, suitable contact between a probe and the object to be inspected may be maintained, damage to the object to be inspected may be suppressed, and the durability of the probe may be improved.

BEST MODE FOR CARRYING OUT THE INVENTION

Figure 1:
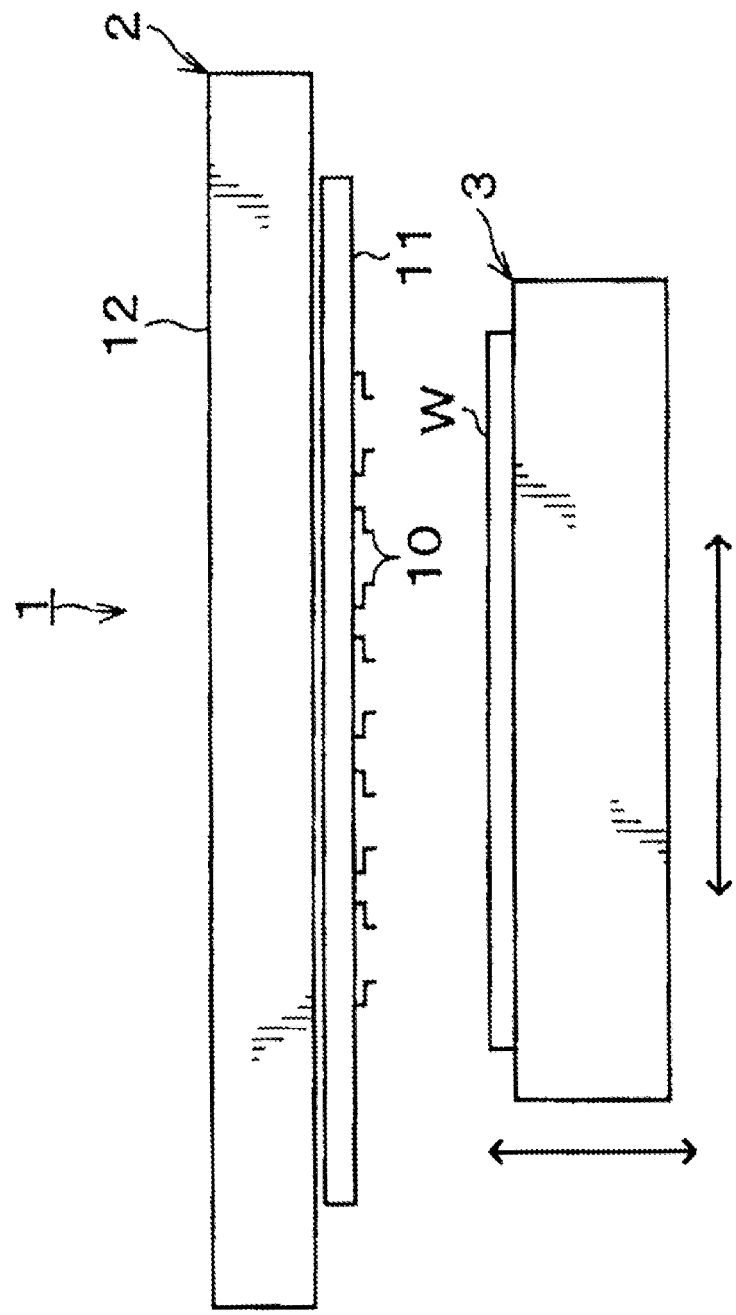
FIG. 1 is a side view schematically showing a configuration of a probe device including a probe according to an embodiment of the present invention.

Herein below, preferable embodiments of the present invention will be explained. FIG. 1 is an explanatory side view schematically showing a configuration of a probe device 1 including a probe according to an embodiment of the present invention.

The probe device 1 includes a probe card 2, and a holding stage 3 on which a wafer W as an object to be inspected is placed.

The probe card 2 includes a contactor 11 acting as a holding member and having a bottom surface on which a plurality of probes 10 contacting electrodes of the wafer W are held, and a printed wiring board 12 transmitting to and receiving from the probes 10 an electrical signal through a main body of the contactor 11. The contactor 11 is formed to face the holding stage 3, and the probes 10 held on the contactor 11 are formed corresponding to a position of the electrodes of the wafer W. Each of the contactor 11 and the printed wiring board 12 may be formed to have, for example, a nearly disk shape. The printed wiring board 12 is disposed above a top surface of the contactor 11. The printed wiring board 12 and the contactor 11 are electrically connected by, for example, a connection pin (not shown), and the connection pin is connected to a connection terminal 11a formed on the top surface of the contactor 11.

Figure 2:
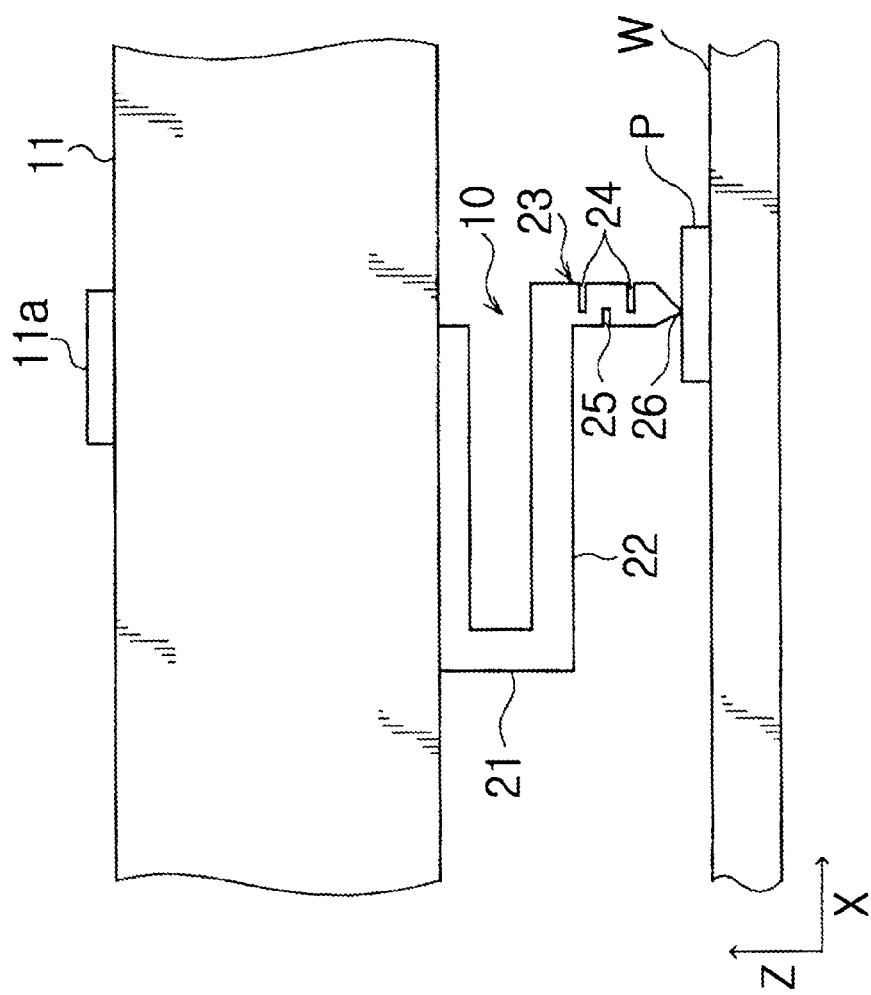
FIG. 2 is a side view schematically showing a configuration of the probe.

The probes 10 are formed of a conductive metal material, for example, nickel cobalt. As shown in FIG. 2, each of the probes 10 is held on the contactor 11, and includes a holding portion 21 protruding from the bottom surface of the contactor 11. The holding portion 21 passes through the contactor 11 in a thickness direction, and an upper end of the holding portion 21 is connected to the connection terminals 11 a formed on the top surface of the contactor 11. A beam portion 22 is formed on a lower end of the holding portion 21, and the beam portion 22 is cantilevered by the holding portion 21 at a predetermined interval from the contactor 11. A contact 23 extending downward in a direction perpendicular to the beam portion 22 is formed at a free end of the beam portion 22.

Outer cut portions 24 are vertically formed, for example, at 2 places, on a free end side (a positive direction of the X-axis of FIG. 2 (hereinafter, referred to as an outer side)) of the beam portion 22 in a side portion of the contact 23. Also, an inner cut portion 25 is formed, for example, at 1 place, on a fixed end side (a negative direction of the X-axis of FIG. 2 (hereinafter, referred to as an inner side)) of the beam portion 22 in a side portion of the contact 23. The inner cut portion 25 is formed between the two outer cut portions 24. That is, the outer cut portions 24 and the inner cut portion 25 are alternately formed in a vertical direction. Each of the outer cut portion 24 and the inner cut portion 25 extends in a horizontal direction up to over the front end portion 26 of the contact 23, so that the contact 23 is not compressed in the vertical direction due to the outer cut portions 24 and the inner cut portion 25. The front end portion 26 is formed to lean the inner side from a center of the contact 23. Besides, when the front end portion 26 of the contact 23 is pressure-contacted to an electrode P on the wafer at a predetermined contact pressure at the time of inspection, the contact 23 is configured to bend at the positions of the outer cut portions 24 and the inner cut portion 25 formed in the side portion of the contact 23. Also, the numbers of the outer cut portion 24 and the inner cut portion 25 formed in the side portion of the contact 23, lengths of the outer cut portion 24 and the inner cut portion 25, and the like are set based on the material and the length of the contact 23, the predetermined contact pressure applied to the contact 23, and the like.

Since the holding stage 3 is configured to freely move horizontally and vertically, the holding stage 3 may move the wafer W placed on the holding stage 3 in a three-dimensional manner to make the probe 10 of the probe card 2 contact a desired position on the wafer W, that is, to bring the contact 23 of the probe 10 into appropriate contact with the electrode P on the wafer W.

When electrical characteristics of an electronic circuit of the wafer W are inspected by using the probe device 1 configured as described above, the wafer W is placed on the holding stage 3, and is raised toward the contactor 11 by the holding stage 3, as shown in FIG. 1. Then, each electrode P of the wafer W contacts the front end portion 26 of the contact 23 of a corresponding probe 10, so that an electrical signal is transmitted and received between the printed wiring board 12 and the wafer W through the contactor 11. Accordingly, the electrical characteristics of the electronic circuit of the wafer W are inspected. Next, the wafer W on the holding stage 3 is lowered, thereby ending a series of inspection processes.

Now, the operation of the probe 10 according to the present embodiment at the time of inspection of electrical characteristics of the wafer W will be explained in detail.

Figure 3:
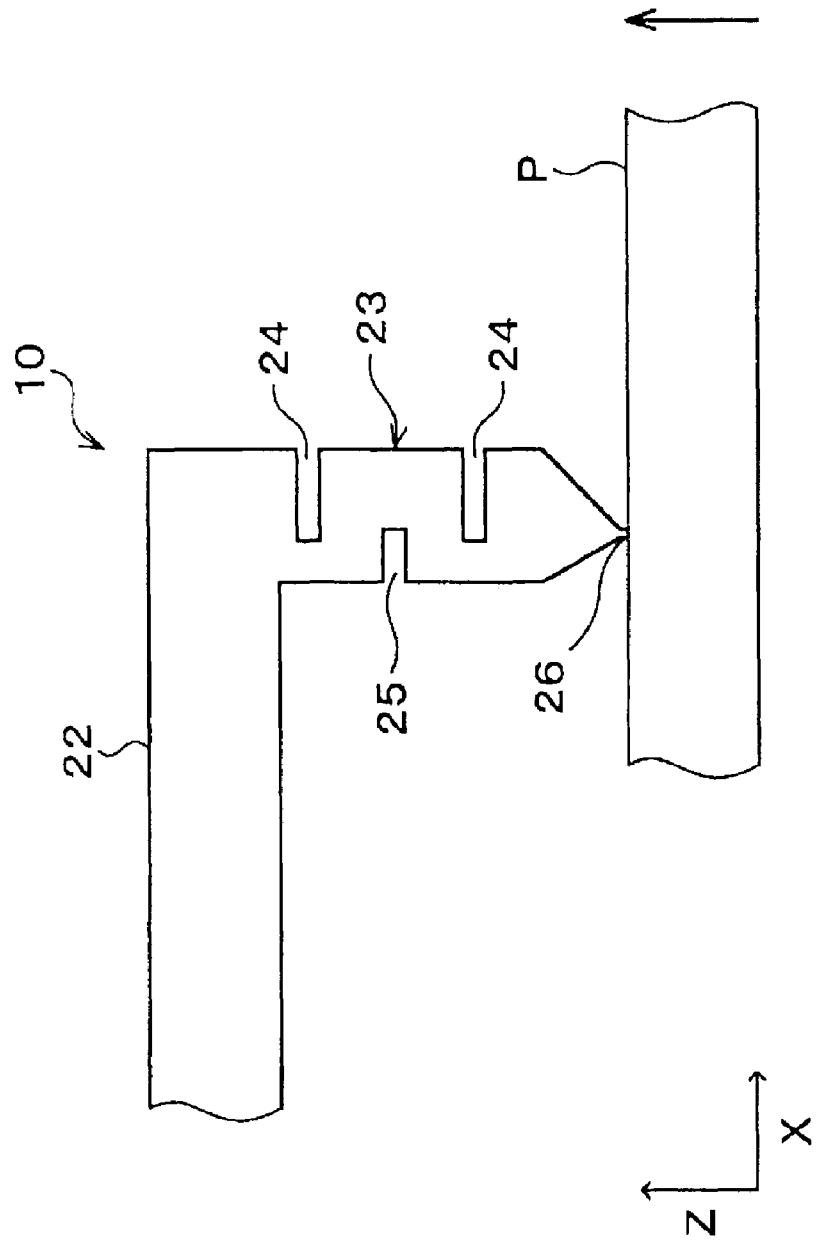
FIG. 3 is a side view showing a state where a contact and an electrode contact each other.

First, as shown in FIG. 3, the wafer W on the holding stage 3 is raised to bring the contact 23 of the probe 10 and the electrode P of the wafer W into contact with each other.

Figure 4:
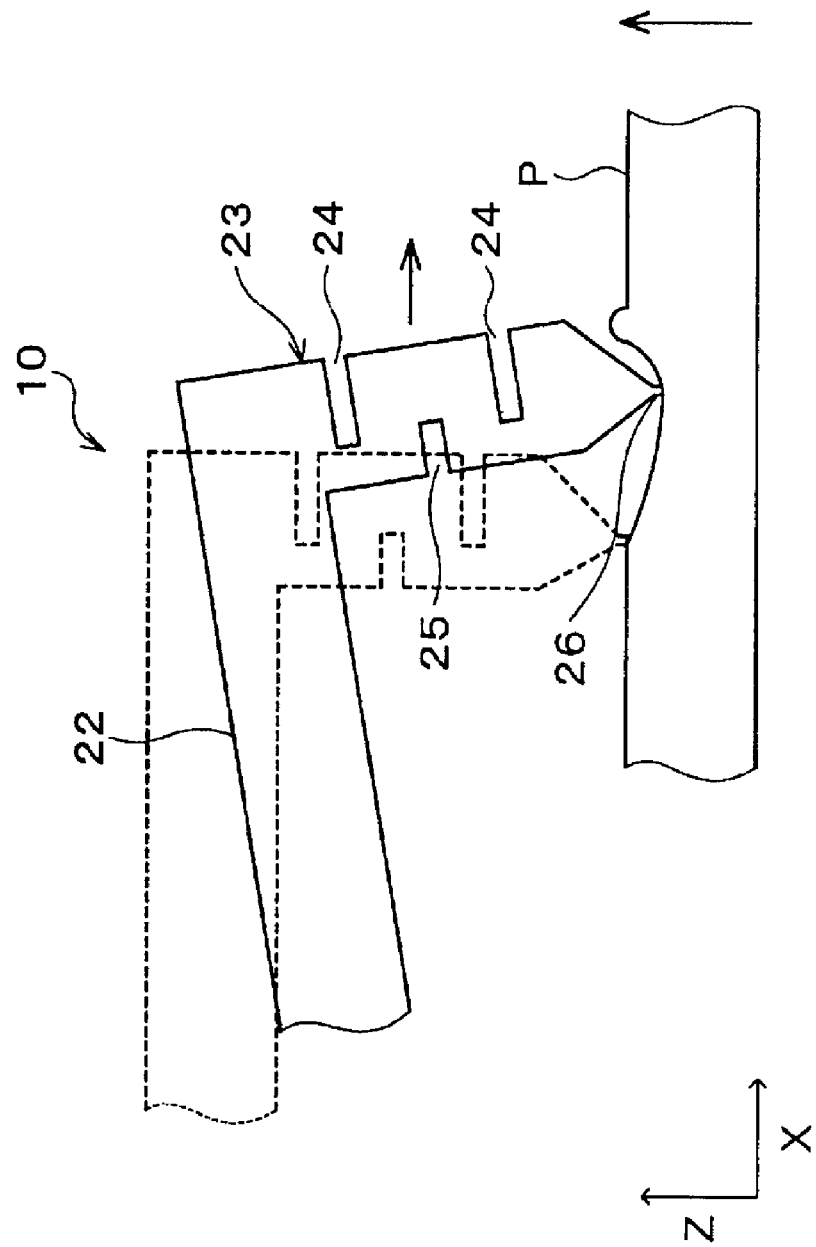
FIG. 4 is a side view showing a state where the contact is moving on an electrode.

Next, overdrive is applied while increasing a contact pressure between the contact 23 and the electrode P, so that the beam portion 22 of the probe 10 bends in the vertical direction to move the contact 23 to the outer side (the positive direction of the X-axis of FIG. 4), as shown in FIG. 4. At this time, since the contact pressure does not reach a predetermined value, the contact 23 moves while maintaining its shape. Then, due to the front end portion 26 of the contact 23, an aluminum oxide film on an outer surface of the electrode P is cut off, thereby exposing a conductive portion of the electrode P.

Figure 5:
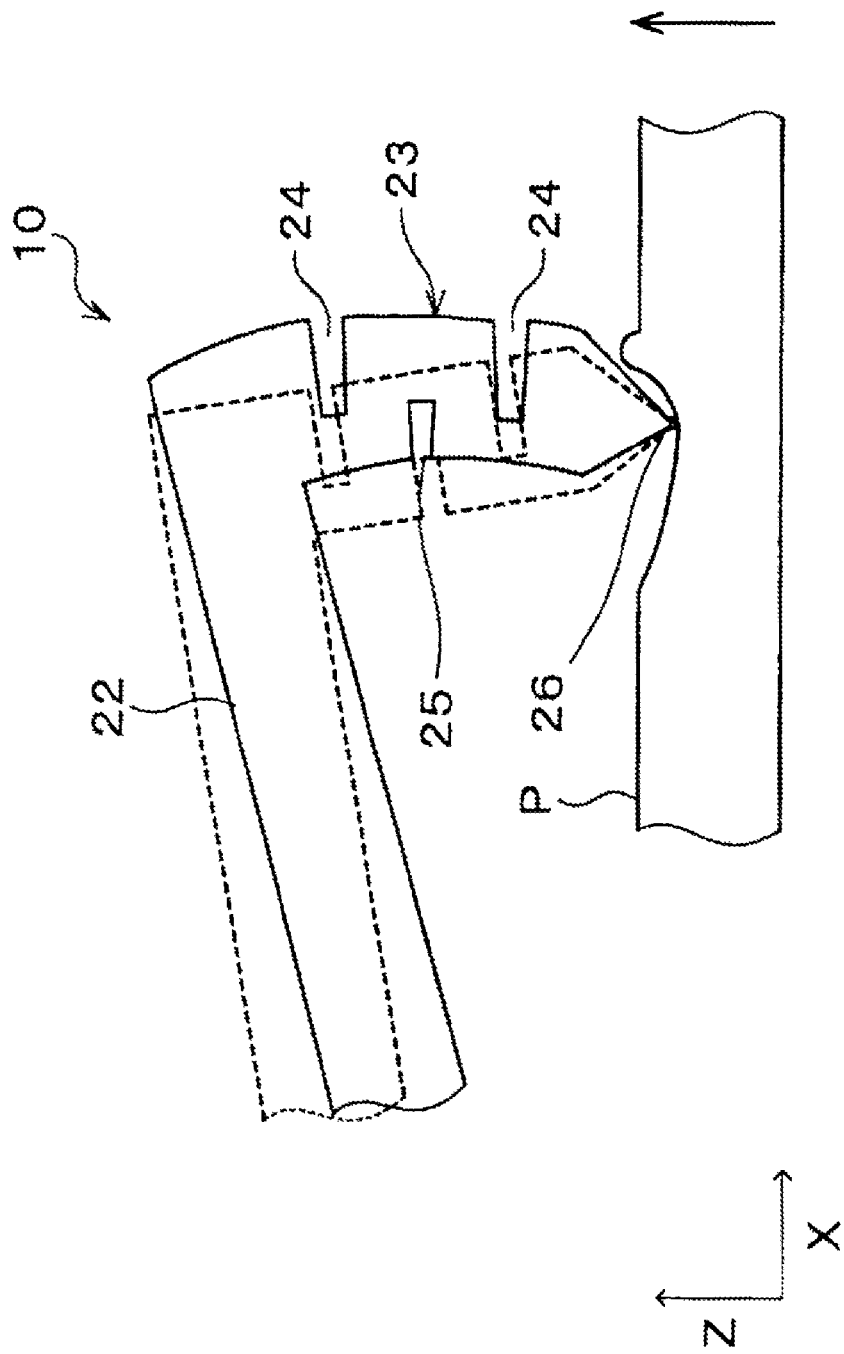
FIG. 5 is a side view showing a state where the contact bends on the electrode.

Afterward, when the contact pressure between the contact 23 and the electrode P reaches a predetermined contact pressure, the contact 23 bends to the outer side (the positive direction of the X-axis of FIG. 5) due to the outer cut portions 24 and the inner cut portion 25, as shown in FIG. 5. At this time, the outer cut portions 24 widens so that the side portion of the outer side of the contact 23 extends, and the inner cut portion 25 narrows so as to absorb a stress applied to the inner side of the contact 23. Bending of the contact 23 is occurred because a force for moving the contact 23 in the horizontal direction is less than a friction applied to the front end portion 26, and movement of the front end portion 26 is stopped due to the friction. Then, inspection of electrical characteristics of the electronic circuit of the wafer W is performed. Also, the outer cut portion 24 and the inner cut portion 25 may be formed to stop the front end portion 26 while bending the contact 23.

Figure 6:
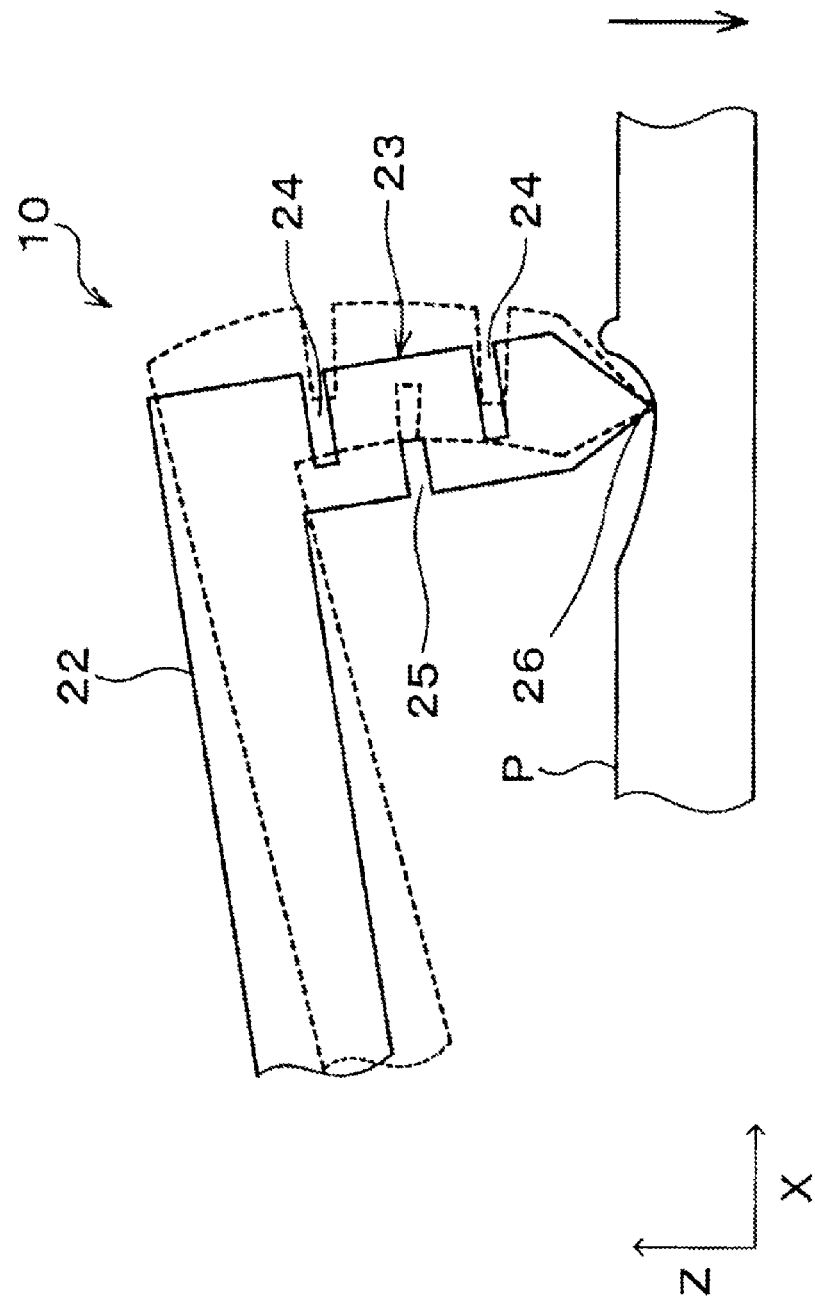
FIG. 6 is a side view showing a state where bending of the contact is being corrected.
Figure 7:
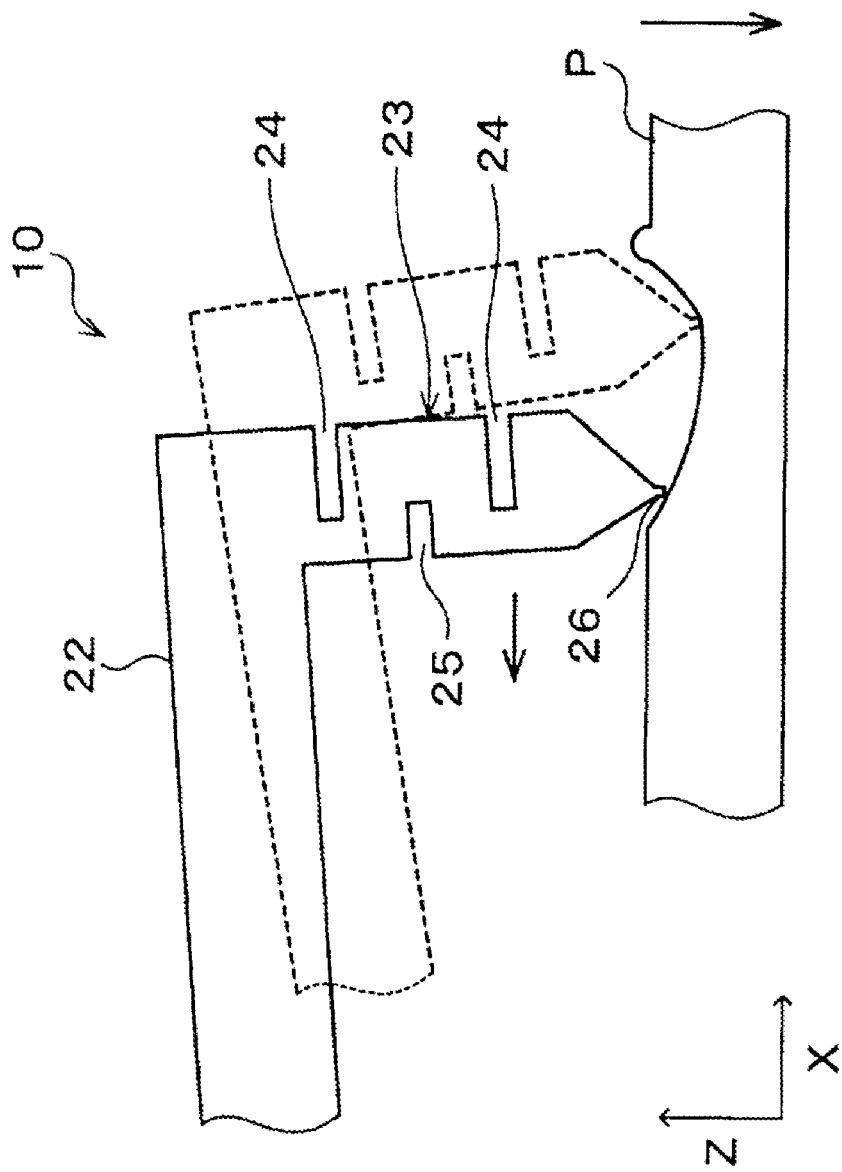
FIG. 7 is a side view showing a state where the contact is moving on the electrode.

Next, if the inspection of the electrical characteristics is completed, the wafer W on the holding stage 3 is lowered. Then, the contact pressure applied to the front end portion 26 is reduced for a short period of time after the start of the lowering of the wafer W. However, since the bending of the contact 23 is restored, as shown in FIG. 6, the front end portion 26 does not move. That is, although the contact pressure applied to the front end portion 26 is reduced while bending of the contact 23 is being corrected, the front end portion 26 stands still. The wafer W is additionally lowered, the shape of the contact 23 returns to its original one, and the friction applied to the front end portion 26 is reduced, and then as shown in FIG. 7, the contact 23 moves to the inner side. Next, the probe 10 returns to its position before the inspection, and the wafer W is lowered to a predetermined position, thereby completing a series of inspection processes.

According to the aforesaid embodiments, since the probe 10 includes the beam portion 22 that is cantilevered, and the contact 23 extending downward perpendicularly to the free end of the beam portion 22, when electrical characteristics of the electronic circuit of the wafer W are inspected, the beam portion 22 bends in the vertical direction, so that a predetermined contact pressure between the contact 23 and the electrode P of the wafer W may be maintained, thereby maintaining suitable contact between the probe 10 and the wafer W. Also, since the outer cut portions 24 and the inner cut portion 25 are formed in the side portion of the contact 23, the beam portion 22 bends in the vertical direction while the contact 23 bends in the horizontal direction at the time of inspection, as described above. Since a force for moving the contact 23 in the horizontal direction is less than a friction applied to the front end portion 26 when the contact 23 bends, movement of the front end portion 26 due to overdrive is easily stopped by the friction, compared to a conventional art without the cut portions 24 and 25. Accordingly, since a movement length of the front end portion 26 is less than that of the conventional art and a movement depth is also reduced, the amount of impurities and aluminum of the electrode P of the wafer W cut off by the contact 23 is reduced. Accordingly, the frequency of cleaning the contact 23 is reduced, thereby improving the durability of the probe 10. Since the beam portion 22 bends in the vertical direction and the contact 23 bends in the horizontal direction, in inspection of electrical characteristics of the electronic circuit of the wafer W, as described above, suitable contact between the probe 10 and the wafer W may be maintained, damage to the wafer W may be suppressed, and the durability of the probe 10 may be improved.

Figure 8:
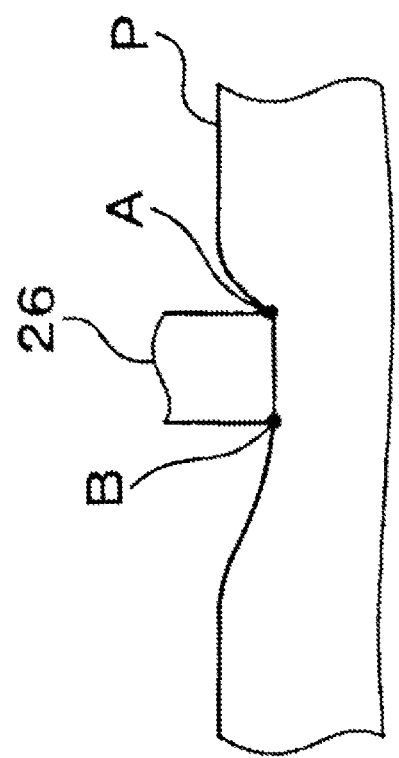
FIG. 8 is a side view showing a state where the electrode and a front end portion of the contact that has restored from bent state contact each other.
Figure 9:
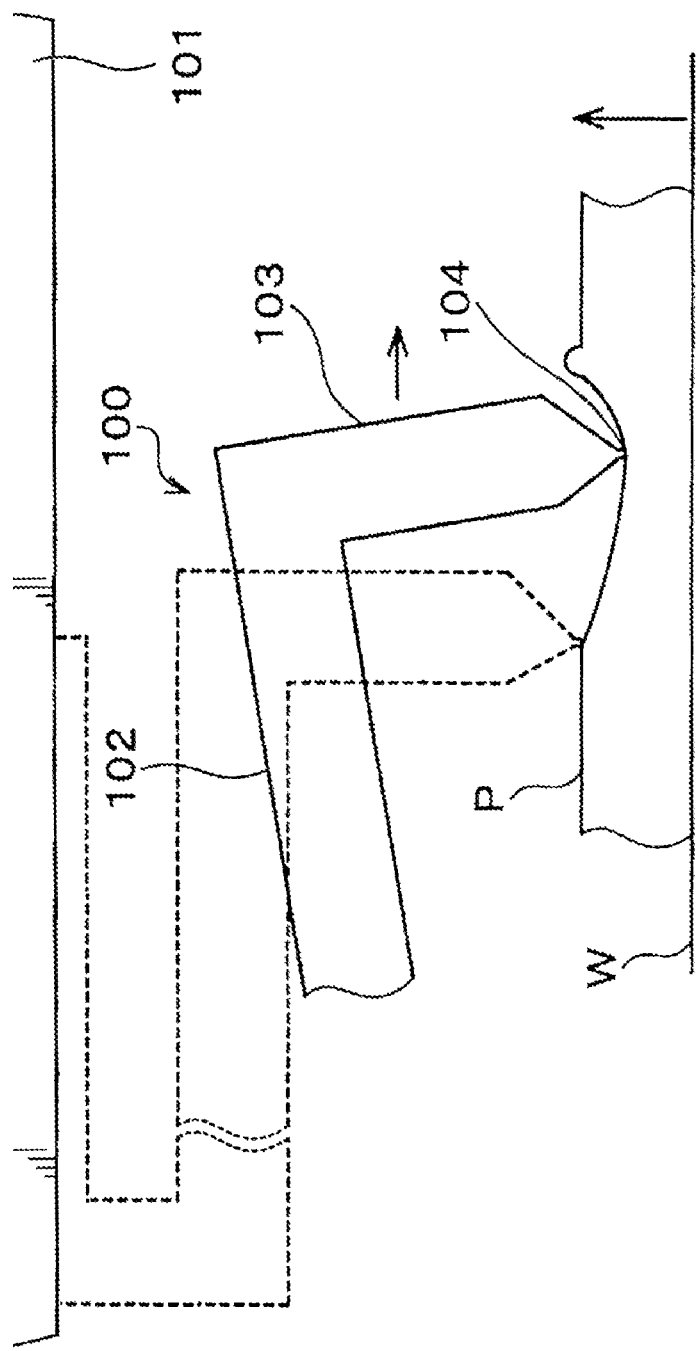
FIG. 9 is a side view schematically showing a configuration of a conventional probe.
Figure 10:
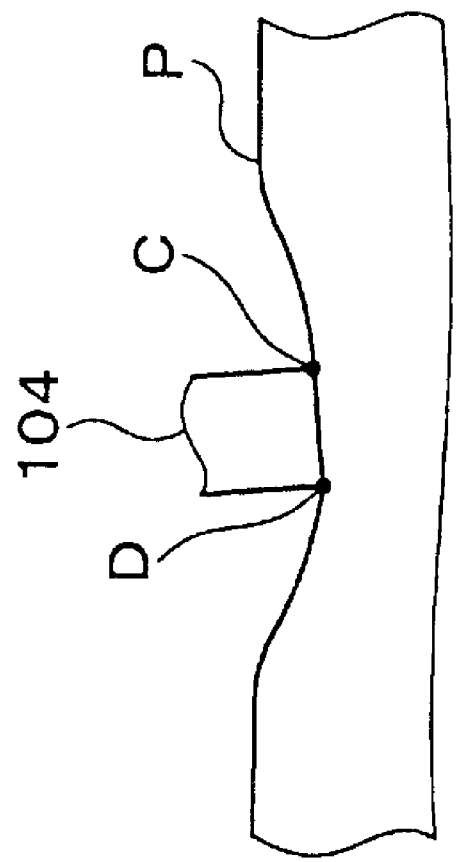
FIG. 10 is a side view showing a state where a conventional front end portion and the electrode contact each other.
Figure 11:
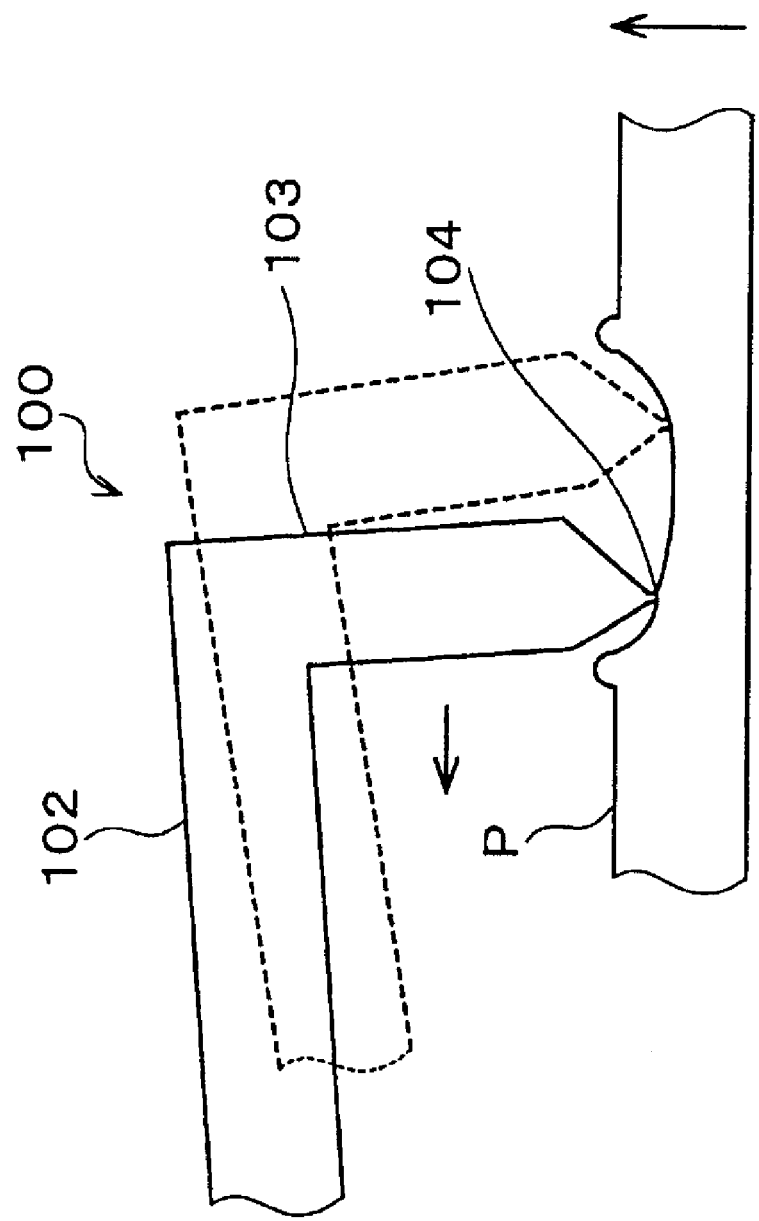
FIG. 11 is a side view showing a state where a conventional contact is moving on an electrode.

Moreover, since the contact 23 starts moving after standing still for a moment when the wafer W is lowered, according to the aforesaid embodiments, the front end portion 26 may move after a contact pressure applied to a bottom surface of the front end portion 26 is reduced. That is, the contact pressure (friction) applied to the front end portion 26 of the contact 23 that is moving is reduced. Also, as shown in FIG. 8, an outer side A and an inner side B of the bottom surface of the front end portion 26 of the contact 23 that has restored from bending are almost parallel to each other. However, since a bottom surface of a front end portion 104 of a contact 103 is inclined so that an inner side D is lower than an outer side C, in the conventional art, as shown in FIG. 10, a contact pressure applied to the front end portion 104 is higher at the inner side D than at the outer side C. Here, when the wafer W is lowered, the contact 103 moves to the inner side while an inclination state where a strong pressure is applied to the inner side D is maintained, as shown in FIG. 11. That is, since the contact 103 moves in a state where a high contact pressure is applied, the amount of aluminum cut off on the inner side D is increased. Accordingly, since the contact pressure applied to the bottom surface of the front end portion 26 according to the present embodiment is less than the contact pressure applied to the bottom surface and the inner side D of the front end portion 104 according to the conventional art, the amount of impurities cut off by the contact 23 when the wafer W is lowered may be reduced.

Although the outer cut portion 24 and the inner cut portion 25 are formed in the side portion of the contact 23 in the above embodiments, only one of the outer cut portion 24 and the inner cut portion 25 may be formed. That is, only the outer cut portion 24 may be formed at a plurality of places, or only the inner cut portion 25 may be formed at a plurality of places, in the side portion of the contact 23.

Although the front end portion 26 of the contact 23 leans to the inner side from the center of the contact 23 in the above embodiments, the front end portion 26 may lean to the outer side from the center of contact 23, or may be formed at the center of the contact 23.

While the present invention has been particularly described with reference to appropriate embodiments thereof by referring to the attached drawings, it will be understood by those of ordinary skill in the art that various changes in form and details may be made therein without departing from the spirit and scope of the present invention as defined by the following claims. The present invention is not limited to the embodiments and may adopt various other types. The present invention may also be used even when a substrate is not a wafer but a substrate such as a mask reticle for photomask or an FPD (flat panel display).

INDUSTRIAL APPLICABILITY

The present invention may be used for a probe for inspecting electrical characteristics of an object to be inspected, for example, a semiconductor wafer or the like.

The invention claimed is:
1. A probe for inspecting electrical characteristics of an object to be inspected by contacting the object to be inspected, the probe comprising:
a beam portion having a fixed end and a free end, and cantilevered by a holding member at the fixed end; and
a contact perpendicular to the beam portion, and extending from the free end of the beam portion toward the object to be inspected,
wherein the contact is formed of nickel-cobalt,
two cut portions are formed on an outer side portion of the contact at different heights, one cut portion is formed on an inner side portion of the contact at a height between the different heights, the inner side portion of the contact being a side portion of the contact which is toward the fixed end of the beam portion, and the outer side portion of the contact being a side portion of the contact which is opposite to the inner side portion of the contact,
each of the two cut portions is extended in perpendicular to a surface of the inner side portion of the contact up to over a front end portion of the contact, and the one cut portion is extended in perpendicular to a surface of the outer side portion of the contact up to over the front end portion of the contact; and the contact is bent while the beam portion is bent due to a pressure applied to the contact such that each of the two cut portions widens and the one cut portion narrows.

* * * * *